(12) United States Patent
Takamura et al.

(10) Patent No.: US 10,288,686 B2
(45) Date of Patent: May 14, 2019

(54) SEMICONDUCTOR INTEGRATED CIRCUIT FOR MONITORING SWITCH, ELECTRONIC CONTROL UNIT AND VEHICLE

(71) Applicant: Rohm Co., Ltd., Kyoto (JP)

(72) Inventors: Shogo Takamura, Kyoto (JP); Isao Niwa, Kyoto (JP); Yuji Kaneda, Kyoto (JP); Yuzo Mizushima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 82 days.

(21) Appl. No.: 15/648,574

(22) Filed: Jul. 13, 2017

(65) Prior Publication Data

US 2018/0024195 A1 Jan. 25, 2018

(30) Foreign Application Priority Data

Jul. 20, 2016 (JP) .................................. 2016-142351

(51) Int. Cl.
*G01R 31/327* (2006.01)
*H01H 9/16* (2006.01)
*G01R 31/00* (2006.01)

(52) U.S. Cl.
CPC ....... *G01R 31/327* (2013.01); *G01R 31/3277* (2013.01); *H01H 9/167* (2013.01); *G01R 31/007* (2013.01)

(58) Field of Classification Search
CPC .......................... G01R 31/327; G01R 31/3277; G01R 31/007; H01H 9/167
See application file for complete search history.

(56) References Cited

U.S. PATENT DOCUMENTS

2015/0198666 A1* 7/2015 Edwards ................ H03K 17/18
324/415

FOREIGN PATENT DOCUMENTS

JP 2001-216878 8/2001

OTHER PUBLICATIONS

Freescale Semiconductor Document No. MC33975, Multiple Switch Detection Interface with Suppressed Wake-up and 32 mA Wetting Current, Jan. 2014 (Year: 2014).*
Maxim MAX13362 24-Channel Automotive Switch Monitor, Feb. 2009 (Year: 2009).*

* cited by examiner

*Primary Examiner* — Daniel R Miller
(74) *Attorney, Agent, or Firm* — Fish & Richardson P.C.

(57) ABSTRACT

A semiconductor integrated circuit for monitoring a switch, including: a first detection part that detects a state of a first switch; a second detection part that detects a state of a second switch; a sub-voltage monitoring part that monitors whether the sub-voltage is within a predetermined range; a switch monitoring part that monitors a change in a state of the first switch and a change in a state of the second switch; a setting part that determines an invalid period, during which the monitoring result of the switch monitoring part regarding the change in the state of the second switch is invalidated; and a transmission part that transmits the monitoring result of the switch monitoring part and information on the invalid period.

10 Claims, 11 Drawing Sheets

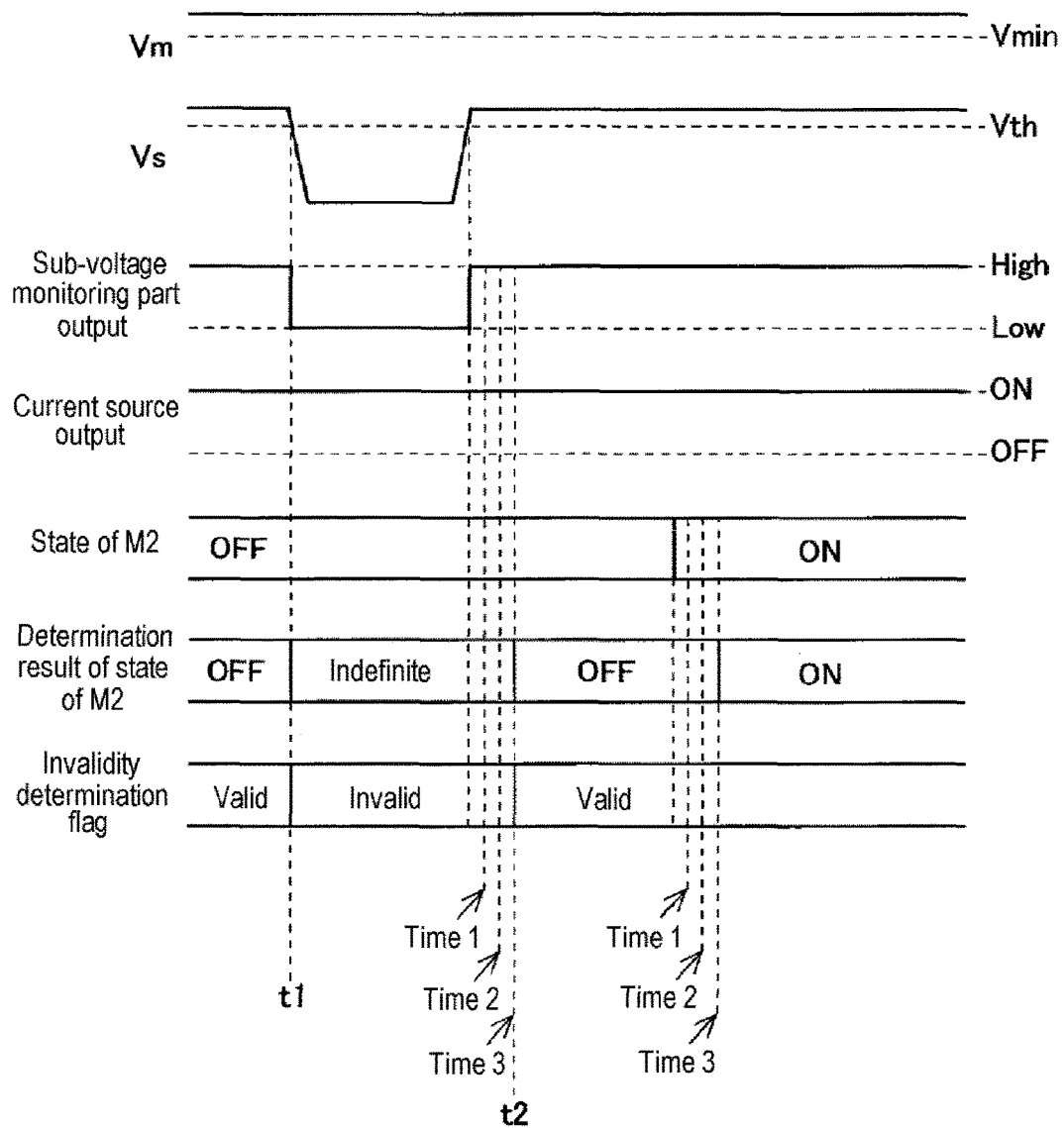

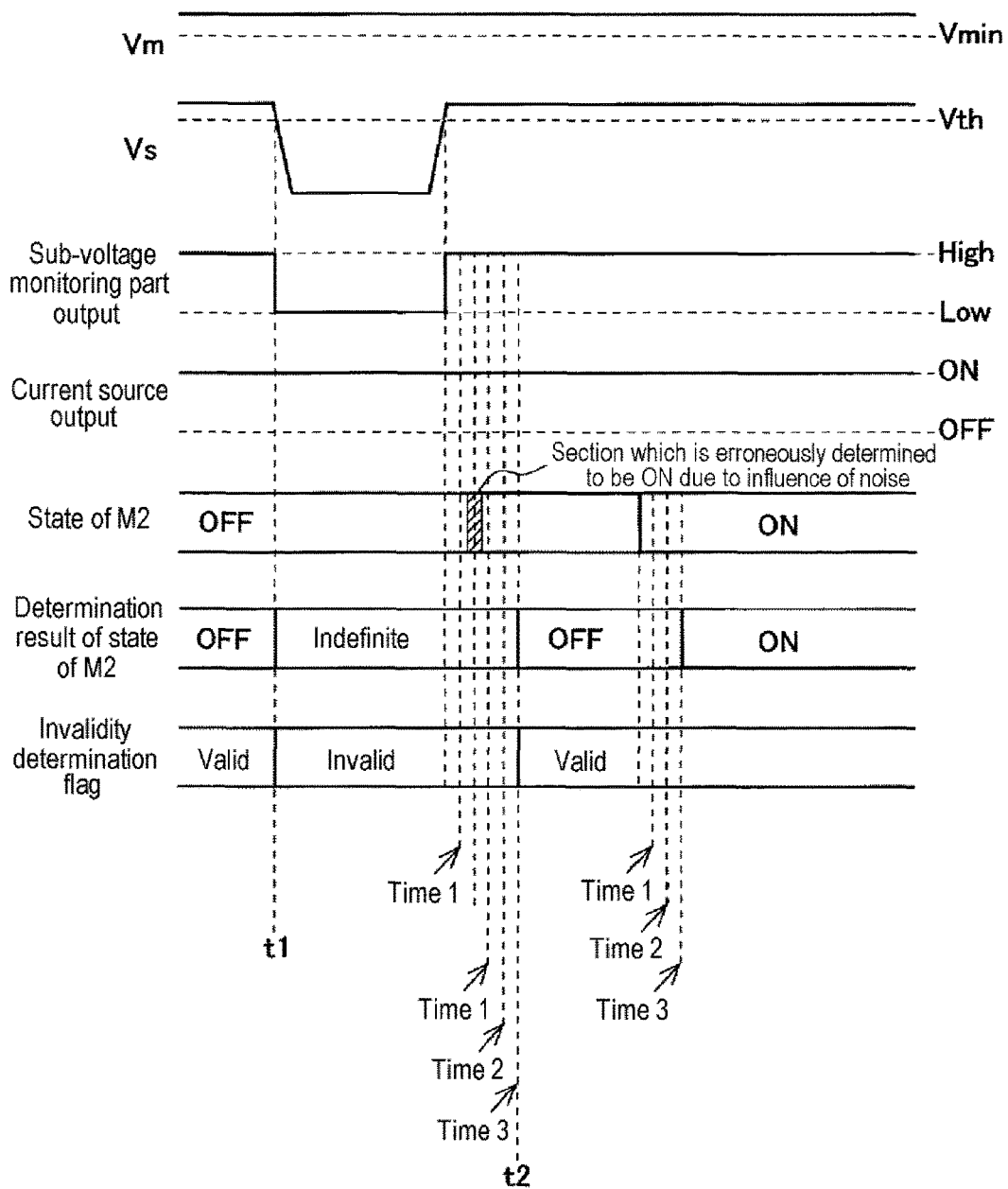

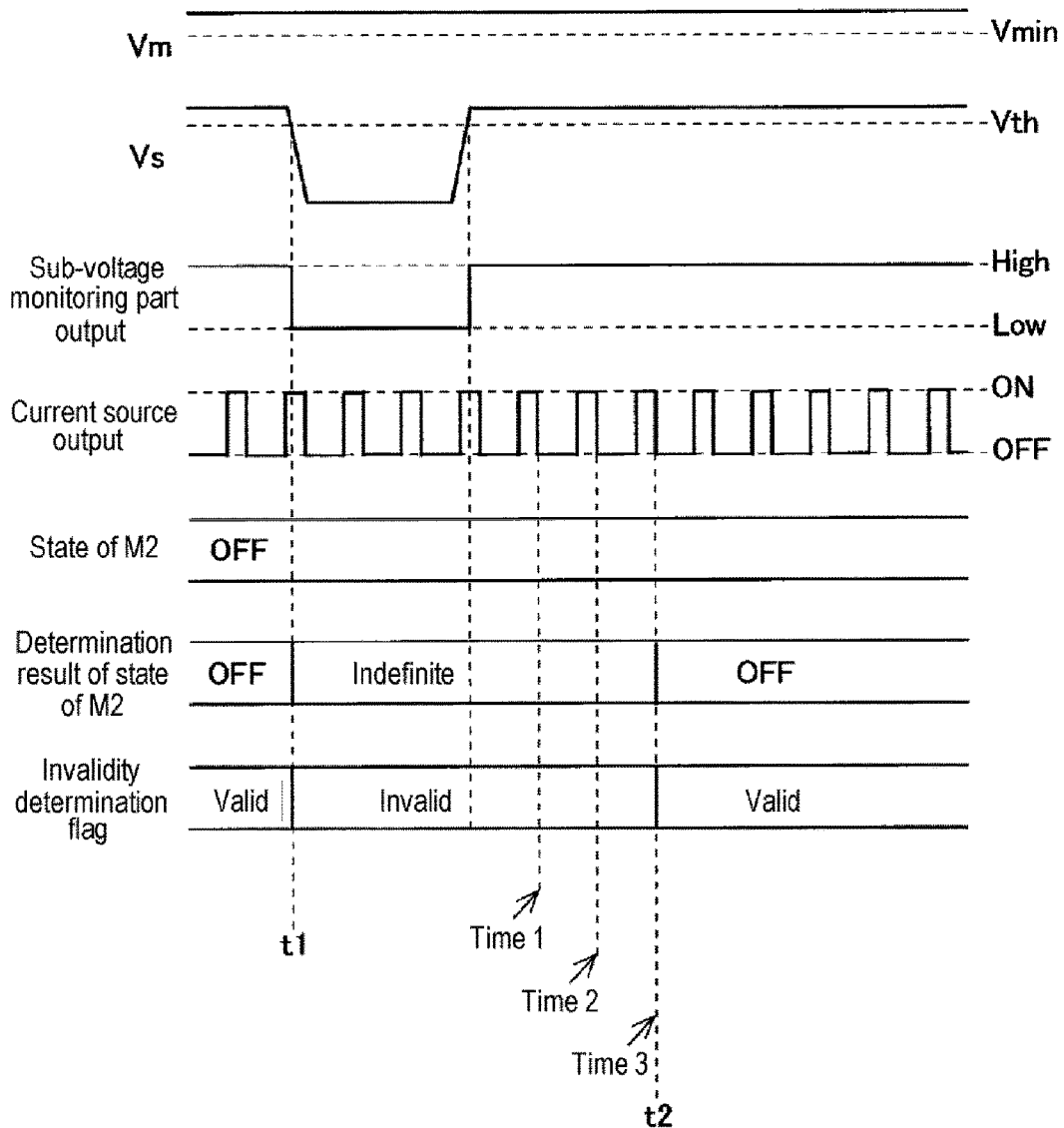

X10

SEMICONDUCTOR INTEGRATED CIRCUIT FOR MONITORING SWITCH, ELECTRONIC CONTROL UNIT AND VEHICLE

CROSS-REFERENCE TO RELATED APPLICATION

This application is based upon and claims the benefit of priority from Japanese Patent Application No. 2016-142351, filed on Jul. 20, 2016, the entire contents of which are incorporated herein by reference.

TECHNICAL FIELD

The present disclosure relates to a semiconductor integrated circuit for monitoring a change in a state of a switch, and an electronic control unit and a vehicle having the same.

BACKGROUND

There are various switch monitoring circuits for monitoring a change in a state of a switch being currently used. For example, there are switch state monitoring circuits that monitor an ON/OFF state of a protection target switch.

Switch state monitoring circuits are configured to monitor an ON/OFF state of a monitoring target switch only when an ignition switch is ON. However, for example, a vehicle may separately have a battery and an ignition power source to supply power. In this case, there is a switch whose state is to be monitored even when the ignition switch is OFF. Thus, there is a demand for a switch state monitoring circuit that can appropriately select a monitoring target switch according to a state of the ignition switch.

SUMMARY

Some embodiments of the present disclosure provide a switch monitoring semiconductor integrated circuit capable of appropriately selecting a monitoring target switch according to a state of a sub-voltage supplied from the outside, and an electronic control unit and a vehicle having the same.

According to one embodiment of the present disclosure, there is provided a semiconductor integrated circuit (IC) for monitoring a switch including: a first detection part configured to detect a state of a first switch when a main voltage supplied from outside is equal to or higher than a first predetermined value; a second detection part configured to detect a state of a second switch when the main voltage is equal to or higher than the first predetermined value and a sub-voltage supplied from outside is equal to or higher than a second predetermined value; a sub-voltage monitoring part configured to monitor whether the sub-voltage is within a predetermined range (where a minimum value of the predetermined range the second predetermined value); a switch monitoring part configured to monitor a change in a state of the first switch according to a detection result of the first detection part and to monitor a change in a state of the second switch according to a detection result of the second detection part; a setting part configured to determine an invalid period, during which a monitoring result of the switch monitoring part regarding the change in the state of the second switch is invalidated, according to a monitoring result of the sub-voltage monitoring part; and a transmission part configured to transmit a monitoring result of the switch monitoring part and information on the invalid period determined by the setting part outside of the semiconductor IC (first configuration).

In the first configuration, the switch monitoring part may be configured to sample the detection result of the second detection part at a predetermined sampling period, and determine that the state of the second switch has been changed when the same detection result continues a predetermined number of times after the detection result of the second detection part is changed. Here, the setting part may be configured to set an end time of the invalid period based on a timing when the switch monitoring part determines that the state of the second switch has been changed after the sub-voltage has been changed from outside of the predetermined range into the predetermined range (second configuration).

In the first and second configurations, the circuit may further include a power source part configured to convert the main voltage into a source voltage and output the source voltage, wherein the source voltage is supplied to each of the first detection part, the second detection part, the sub-voltage monitoring part, the switch monitoring part, and the setting part (third configuration).

In any one of the first to third configurations, when the first switch has been changed from a first state to a second state, the transmission part may transmit the monitoring result, which indicates the change of the first switch from the first state to the second state, outside of the semiconductor IC (fourth configuration).

In any one of the first to fourth configurations, the transmission part may transmit the monitoring result of the switch monitoring part and the information on the invalid period determined by the setting part outside of the semiconductor IC through serial communication (fifth configuration).

In the fifth configuration, the serial communication may be serial peripheral interface (SPI) communication (sixth configuration).

According to another embodiment of the present disclosure, there is provided an electronic control unit including: the switch monitoring semiconductor IC of any one of the first to sixth configurations; a microcomputer configured to receive the monitoring result of the switch monitoring part and the information on the invalid period determined by the setting part from the switch monitoring semiconductor IC; and a power source circuit configured to convert the main voltage into the sub-voltage and supply the sub-voltage to the switch monitoring semiconductor IC (seventh configuration).

In the seventh configuration, the switch monitoring semiconductor IC may be the switch monitoring semiconductor IC of the fourth configuration, and the transmission part may transmit the monitoring result, which indicates the change of the first switch from the first state to the second state, to the power source circuit, when the first switch has been changed from the first state to the second state. Here, the power source circuit may start an operation of converting the main voltage into the sub-voltage when receiving a signal indicating that the first switch has been changed from the first state to the second state (eighth configuration).

In the eighth configuration, the microcomputer may start up after the power source circuit starts the operation of converting the main voltage into the sub-voltage, and at least a portion of the transmission part may start to be driven by a power source voltage for the transmission part (ninth configuration).

According to another embodiment of the present disclosure, there is provided a vehicle including: a first switch; a second switch; and the electronic control unit of any one of the seventh to ninth configuration (tenth configuration).

BRIEF DESCRIPTION OF THE DRAWINGS

FIG. 8A is a timing chart illustrating a continuous monitoring operation of a switch monitoring semiconductor IC in the second configuration example.

FIG. 8B is a timing chart illustrating a continuous monitoring operation of a switch monitoring semiconductor IC in the second configuration example.

FIG. 9A is a timing chart illustrating an intermittent monitoring operation of a switch monitoring semiconductor IC in the second configuration example.

DETAILED DESCRIPTION

First Configuration Example

<Schematic Configuration>

Figure 1:
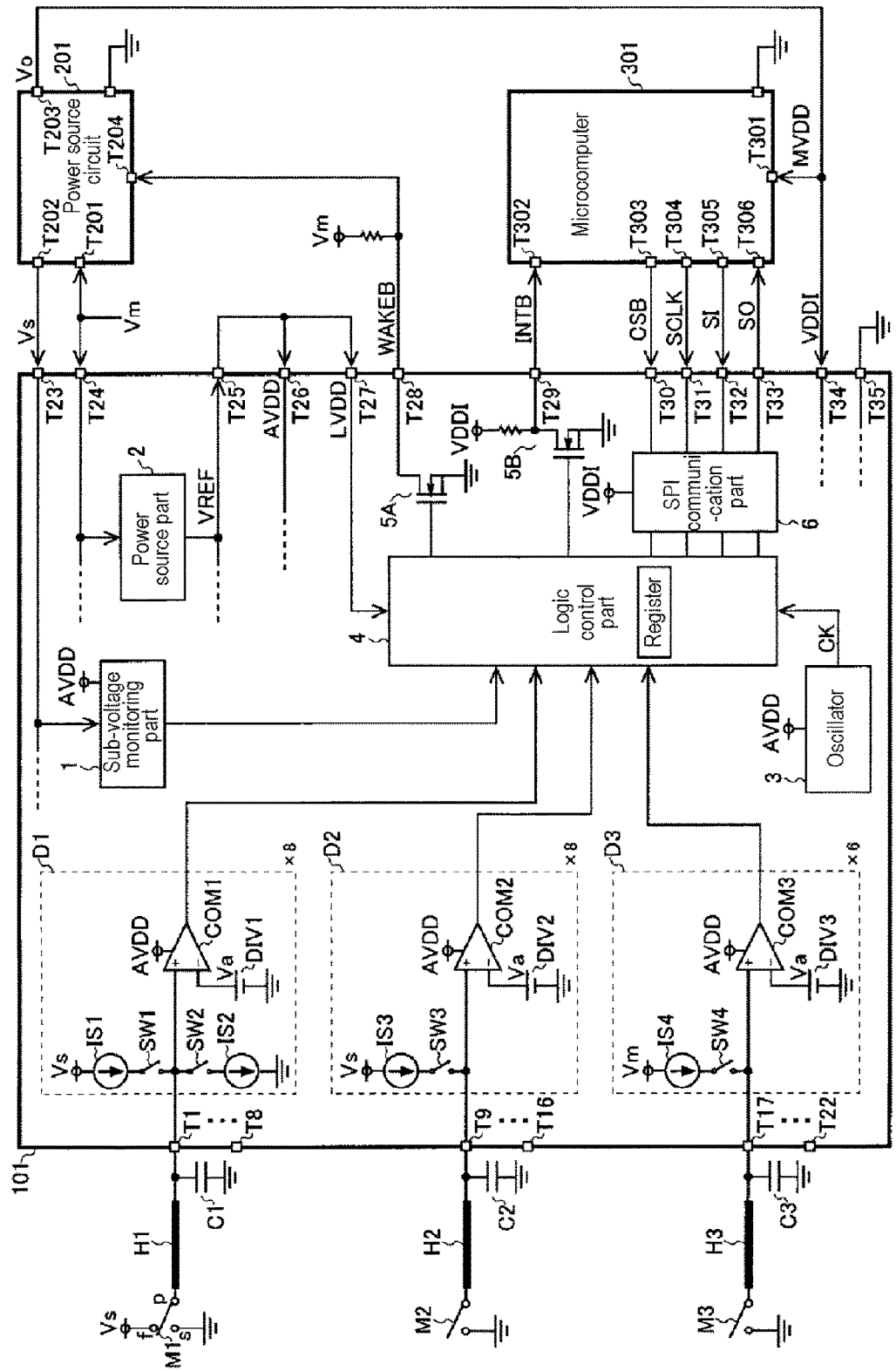
FIG. 1 is a diagram illustrating a first configuration example of an electronic control unit.

FIG. 1 is a diagram illustrating a first configuration example of an electronic control unit. The electronic control unit of FIG. 1 has a switch monitoring semiconductor integrated circuit (IC) 101, a power source circuit 201, and a microcomputer 301.

The switch monitoring semiconductor IC 101 has sub-voltage system switch input terminals T1 to T8, eight sub-voltage system detection parts D1 corresponding to the sub-voltage system switch input terminals T1 to T8 in a one-to-one relationship, sub-voltage system switch input terminals T9 to T16, eight sub-voltage system detection parts D2 corresponding to the sub-voltage system switch input terminals T9 to T16 in a one-to-one relationship, main voltage system switch input terminals T17 to T22, and six main voltage system detection parts D3 corresponding to the main voltage system switch input terminals T17 to T22 in a one-to-one relationship.

<Sub-Voltage System Detection Part D1>

The sub-voltage system detection part D1 has current sources IS1 and IS2, switches SW1 and SW2, a comparator COM1, and a voltage-division circuit DIV1. A sub-voltage Vs is applied to one end of the current source IS1, and the other end of the current source IS1 is connected to a non-inverting input terminal of the comparator COM1 via the switch SW1. One end of the current source IS2 is connected to the non-inverting input terminal of the comparator COM1 via the switch SW2, and the other end of the current source IS2 is grounded. An output terminal of the voltage-division circuit DIV1 is connected to an inverting input terminal of the comparator COM1. As mentioned above, the eight sub-voltage system detection parts D1 respectively correspond to the sub-voltage system switch input terminals T1 to T8. Furthermore, the non-inverting input terminal of the comparator COM1 installed in the sub-voltage system detection part D1 corresponding to the sub-voltage system switch input terminal T1 is connected to the sub-voltage system switch input terminal T1. The non-inverting input terminal of the comparator COM1 installed in the sub-voltage system detection part D1 corresponding to the sub-voltage system switch input terminal T2 is also connected to the sub-voltage system switch input terminal T2. This is the same for the non-inverting input terminal of each comparator COM1 installed in the six sub-voltage system detection parts D1 respectively corresponding to the sub-voltage system switch input terminals T3 to T8.

The comparator COM1 is driven by an analog source voltage AVDD. The voltage-division circuit DIV1 divides a reference voltage VREF to generate a divided voltage Va. When the sub-voltage Vs is within a predetermined range, the divided voltage Va is smaller than the sub-voltage Vs. Details of the analog source voltage AVDD and the reference voltage VREF will also be described below.

Here, as illustrated in FIG. 1, a case where a pole p of a mechanical switch M1 is externally attached to the sub-voltage system switch input terminal T1 via a harness H1 and the sub-voltage system switch input terminal T1 is grounded via a condenser C1 externally attached to the sub-voltage system switch input terminal T1 will be described as an example. In addition, the mechanical switch M1 is a 3-point switch, which has a first mode in which whether to open the switch or whether to connect the pole p to a first contact f is selectively switched and a second mode in which whether to open the switch or whether to connect the pole p to a second contact s are selectively switched, and selects one of the first mode and the second mode. The sub-voltage Vs is supplied to the first contact f of the mechanical switch M1 and the second contact s of the mechanical switch M1 is grounded.

First, a case where the switch SW2 is OFF in a state in which the switch SW1 is ON in the sub-voltage system detection part D1 corresponding to the sub-voltage system switch input terminal T1 will be described. In this case, it is assumed that the mechanical switch M1 is in the second mode. When the mechanical switch M1 is OPEN, since no current flows from the sub-voltage system switch input terminal T1 toward the mechanical switch M1 and an electric potential of the sub-voltage system switch input terminal T1 is substantially identical to the sub-voltage Vs, an output of the comparator COM1 has a high level. On the other hand, when the pole p is connected to the second contact s in the mechanical switch M1, if the sub-voltage Vs is within a predetermined range, since the electric potential of the sub-voltage system switch input terminal T1 from which current flows toward the mechanical switch M1 is substantially identical to a ground potential, the output of the comparator COM1 has a low level.

Next, a case where the switch SW2 is ON in a state in which the switch SW1 is OFF in the sub-voltage system detection part D1 corresponding to the sub-voltage system switch input terminal T1 will be described. In this case, it is assumed that the mechanical switch M1 is in the first mode. When the pole p is connected to the first contact f in the mechanical switch M1, if the sub-voltage Vs is within a predetermined range, since the electric potential of the sub-voltage system switch input terminal T1 to which current flows from the mechanical switch M1 is substantially identical to the sub-voltage Vs, the output of the comparator COM1 has a high level. On the other hand, when the mechanical switch M1 is OPEN, since no current flows from the mechanical switch M1 toward the sub-voltage system switch input terminal T1 and the electric potential of the sub-voltage system switch input terminal T1 is substantially identical to a ground potential, the output of the comparator COM1 has a low level.

Further, the voltage applied to the first contact f of the mechanical switch M1 may be a main voltage Vm, instead of the sub-voltage Vs.

<Sub-Voltage System Detection Part D2>

The sub-voltage system detection part D2 has a current source IS3, a switch SW3, a comparator COM2, and a voltage-division circuit DIV2. A sub-voltage Vs is applied to one end of the current source IS3, and the other end of the current source IS3 is connected to a non-inverting input terminal of the comparator COM2 via the switch SW3. An output terminal of the voltage-division circuit DIV2 is connected to an inverting input terminal of the comparator COM2. As mentioned above, the eight sub-voltage system detection parts D2 respectively correspond to the sub-voltage system switch input terminals T9 to T16. Further, the non-inverting input terminal of the comparator COM2 installed in the sub-voltage system detection part D2 corresponding to the sub-voltage system switch input terminal T9 is connected to the sub-voltage system switch input terminal T9. The non-inverting input terminal of the comparator COM2 installed in the sub-voltage system detection part D2 corresponding to the sub-voltage system switch input terminal T10 is also connected to the sub-voltage system switch input terminal T10. This is the same for the non-inverting input terminal of each comparator COM2 installed in the six sub-voltage system detection parts D2 respectively corresponding to the sub-voltage system switch input terminals T11 to T16.

The comparator COM2 is driven by an analog source voltage AVDD. The dividing circuit DIV2 divides a reference voltage VREF to generate a divided voltage Va. When the sub-voltage Vs is within a predetermined range, the divided voltage Va is smaller than the sub-voltage Vs. Details of the analog source voltage AVDD and the reference voltage VREF will also be described below.

Here, as illustrated in FIG. 1, a case where one end p of a mechanical switch M2 is externally attached to the sub-voltage system switch input terminal T9 via a harness H2 and the sub-voltage system switch input terminal T9 is grounded via a condenser C2 externally attached to the sub-voltage system switch input terminal T1 will be described as an example. In addition, the other end of the mechanical switch M2 is grounded.

A case where the switch SW3 is ON in the sub-voltage system detection part D2 corresponding to the sub-voltage system switch input terminal T9 will be described. In this case, when the mechanical switch M2 is in an OFF state (OPEN), since no current flows from the sub-voltage system switch input terminal T9 toward the mechanical switch M2 and an electric potential of the sub-voltage system switch input terminal T9 is substantially identical to the sub-voltage Vs, if the sub-voltage Vs is within a predetermined range, the output of the comparator COM2 has a high level. On the other hand, when the mechanical switch M2 is in an ON state (CLOSE), if the sub-voltage Vs is within a predetermined range, since an electric potential of the sub-voltage system switch input terminal T9 from which current flows toward the mechanical switch M2 is substantially identical to a ground potential, the output of the comparator COM2 has a low level.

<Main Voltage System Detection Part D3>

The main voltage system detection part D3 has a current source IS4, a switch SW4, a comparator COM3, and a voltage-division circuit DIV3. A main voltage Vm is applied to one end of the current source IS4, and the other end of the current source IS4 is connected to a non-inverting input terminal of the comparator COM3 via the switch SW4. An output terminal of the voltage-division circuit DIV3 is connected to an inverting input terminal of the comparator COM3. As mentioned above, the six main voltage system detection parts D3 respectively correspond to the main voltage system switch input terminals T17 to T22. Further, the non-inverting input terminal of the comparator COM3 installed in the main voltage system detection part D3 corresponding to the main voltage system switch input terminal T17 is connected to the main voltage system switch input terminal T17. The non-inverting input terminal of the comparator COM3 installed in the main voltage system detection part D3 corresponding to the main voltage system switch input terminal T18 is also connected to the main voltage system switch input terminal T18. This is the same for the non-inverting input terminal of each comparator COM3 installed in the four main voltage system detection parts D3 respectively corresponding to the main voltage system switch input terminals T19 to T22.

The comparator COM3 is driven by an analog source voltage AVDD. The dividing circuit DIV3 divides a reference voltage VREF to generate a divided voltage Va. The divided voltage Va is smaller than the main voltage Vm. Details of the analog source voltage AVDD and the reference voltage VREF will also be described below.

Here, as illustrated in FIG. 1, a case where one end p of a mechanical switch M3 is externally attached to the main voltage system switch input terminal T17 via a harness H3 and the main voltage system switch input terminal T17 is grounded via a condenser C3 externally attached to the main voltage system switch input terminal T17 will be described as an example. In addition, the other end of the mechanical switch M3 is grounded.

A case where the switch SW4 is ON in the main voltage system detection part D3 corresponding to the main voltage system switch input terminal T17 will be described. In this case, when the mechanical switch M3 is in an OFF state (OPEN), since no current flows from the main voltage system switch input terminal T17 toward the mechanical switch M3 and an electric potential of the main voltage system switch input terminal T17 is substantially identical to the main voltage Vm, the output of the comparator COM3 has a high level. On the other hand, when the mechanical switch M3 is in an ON state (CLOSE), since the electric potential of the main voltage system switch input terminal T17 from which current flows toward the mechanical switch M3 is substantially identical to a ground potential, the output of the comparator COM3 has a low level.

<Sub-Voltage Monitoring Part 1, Etc.>

Further, the switch monitoring semiconductor IC 101 has a transmission part including a sub-voltage monitoring part 1, a power source part 2, an oscillator 3, a logic control part 4, open drain output parts 5A and 5B, and a serial peripheral interface (SPI) communication part 6, and terminals T23 to T35.

Figure 2:
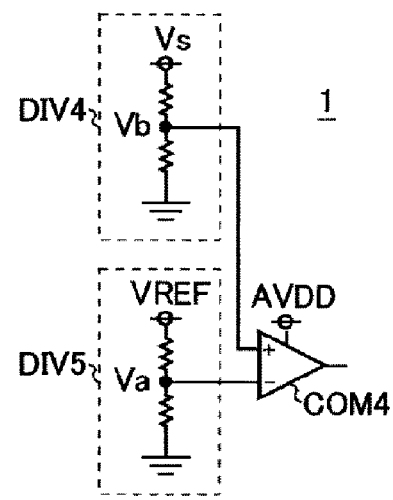
FIG. 2 is a diagram illustrating a configuration example of a sub-voltage monitoring part.

The sub-voltage monitoring part 1 monitors whether the sub-voltage Vs applied to the terminal T23 is within a predetermined range, and when the sub-voltage Vs is within the predetermined voltage, the sub-voltage monitoring part 1 outputs a high level signal, and when the sub-voltage Vs is not within the predetermined range, the sub-voltage monitoring part 1 outputs a low level signal. A configuration example of the sub-voltage monitoring part 1 is illustrated in FIG. 2. The sub-voltage monitoring part 1 of the configuration example of FIG. 2 has dividing circuits DIV4 and DIV5, and a comparator COM4. The voltage-division circuit DIV4 divides the sub-voltage Vs to generate a divided voltage Vb. The voltage-division circuit DIV5 divides the reference voltage VREF to generate a divided voltage Va. The comparator COM4 is driven by an analog source voltage AVDD and compares the divided voltage Vb and the divided voltage Va. The voltage division ratios of the voltage-division circuits DIV4 and DIV5 are set such that the comparator COM4 outputs a high level output signal when the sub-voltage Vs is equal to or higher than a threshold Vth, and outputs a low level output signal when the sub-voltage Vs is lower than the threshold Vth. Here, the threshold Vth is set to be equal to or higher than a minimum value of the sub-voltage Vs at which the sub-voltage system detection parts D1 and D2 can normally execute a detection operation. That is to say, in the configuration example of FIG. 2, when the sub-voltage Vs is equal to or higher than the threshold Vth, the sub-voltage Vs is within the predetermined range. In other words, in the configuration example of FIG. 2, only a lower limit of the predetermined range is set. Unlike the configuration example of FIG. 2, it may be configured that an upper limit of the predetermined range, as well as the lower limit thereof, is set.

The power source part 2 steps down the main voltage Vm applied to the terminal T24 to generate a reference voltage VREF (e.g., 5 V DC voltage). The reference voltage VREF is supplied to each part which uses the reference voltage VREF and the terminal T25. Further, the analog source voltage AVDD applied to the terminal T26 is supplied to each part which uses the analog source voltage AVDD, and a logic source voltage LVDD applied to the terminal T27 is supplied to the logic control part 4. Since the terminals T25, T26, and T27 are short-circuited outside of the switch monitoring semiconductor IC 101, the analog source voltage AVDD and the logic source voltage LVDD become voltages having the same value as that of the reference voltage VREF. The terminals T25 to T27 may also be grounded via a common condenser. The reason for installing the terminals T25 to T27 is because, if they are not short-circuited outside of the switch monitoring semiconductor IC 101, a line to which the reference voltage VREF is applied, a line to which the analog source voltage AVDD is applied, and a line to which the logic source voltage LVDD is applied can be electrically separated, and thus, making it convenient to perform an evaluation test on the switch monitoring semiconductor IC 101. When the main voltage Vm is equal to or higher than a predetermined value, the power source part 2 can normally generate the reference voltage VREF, the circuit driven by the analog source voltage AVDD and the circuit driven by the logic source voltage LVDD can normally operate, and the divided voltage Va of the reference voltage VREF becomes a value equal to a design value.

The oscillator 3 supplies a clock signal CK to the logic control part 4.

The logic control part 4 operates based on the clock signal CK according to a setting written in a register. The logic control part 4 transmits a wake-up bar signal WAKEB from the terminal T28 to a device located outside of the logic control part 4 (the power source circuit 201 in this configuration example) using the open drain output part 5A. The terminal T28 is pull-up processed outside of the switch monitoring semiconductor IC 101. The logic control part 4 transmits an interrupt signal INTB from the terminal T29 to a device located outside of the logic control part 4 (the microcomputer 301 in this configuration example) using the open drain output part 5B. The logic control part 4 performs SPI communication with the outside device (the microcomputer 301 in this configuration example) using the SPI communication part 6 and the terminals T30 to T33.

Figure 3:
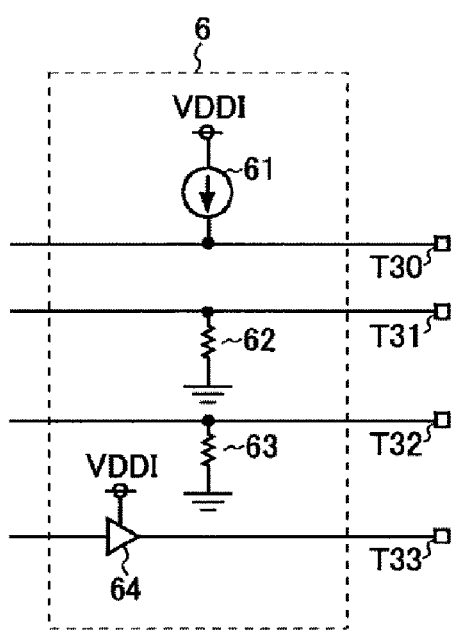
FIG. 3 is a diagram illustrating a configuration example of an SPI communication part.
Figure 4:
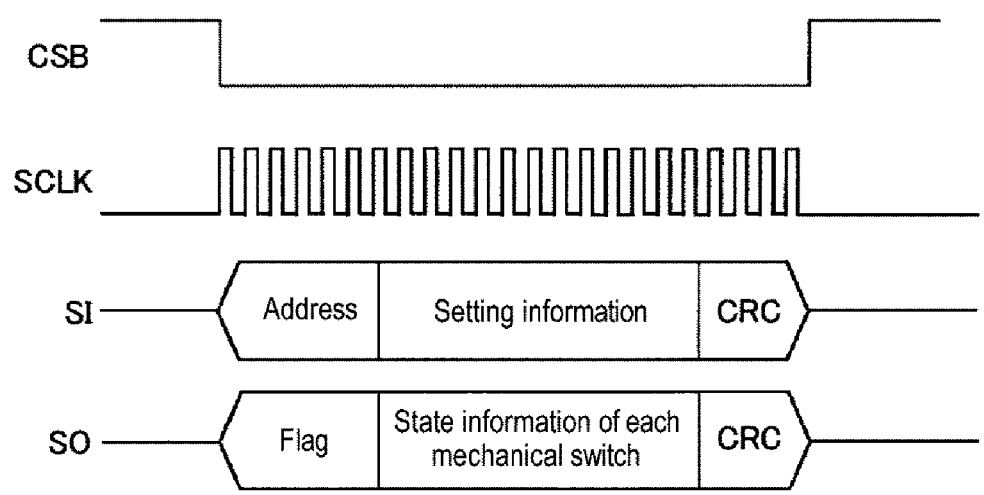
FIG. 4 is a timing chart illustrating an outline of SPI communication.

A configuration example of the SPI communication part 6 is illustrated in FIG. 3. The SPI communication part 6 of the configuration example illustrated in FIG. 3 has a current source 61, pull-down resistors 62 and 63, and a buffer amplifier 64. An input/output source voltage VDDI is applied to one end of the current source 61, and the other end of the current source 61 is connected to the terminal T30. One end of the pull-down resistor 62 is connected to the terminal T31, one end of the pull-down resistor 63 is connected to the terminal T32, and the other ends of the pull-down resistors 62 and 63 are grounded. An output terminal of the buffer amplifier 64 is connected to the terminal T33. FIG. 4 is a timing chart illustrating an outline of SPI communication. When a chip select bar input signal CSB has a low level, a serial clock input signal SCLK, a serial data input signal SI, and a serial data output signal SO becomes valid. The serial data input signal SI includes an address of the register, setting information written in the resistor, and a CRC value. The serial data output signal SO includes a flag, state information of each mechanical switch, and a CRC value. The flag of the serial data output signal SO includes an interrupt factor flag indicating an interrupt factor and an invalidity determination flag indicating that the state information of the mechanical switches connected to the sub-voltage system switch input terminals T1 to T6 is invalid.

The open drain output part 5B and the SPI communication part 6 is driven by the input/output source voltage VDDI applied to the terminal T34.

The power source circuit 201 converts the main voltage Vm applied to the terminal T201 into the sub-voltage Vs and an output voltage Vo. The sub-voltage Vs is output from the terminal T202 and the output voltage Vo is output from the terminal T203. The power source circuit 201 uses a signal applied to the terminal T204 as an enable signal. In one usage example of the enable signal, the conversion operation from the main voltage Vm into the sub-voltage Vs is enabled when a signal applied to the terminal T204 has a low level, and the conversion operation from the main voltage Vm into the sub-voltage Vs is disabled when the signal applied to the terminal T204 has a high level. Further, in another usage example of the enable signal, the entire power source circuit 201 is enabled when the signal applied to the terminal T204 has a low level, and the entire power source circuit 201 is disabled when the signal applied to the terminal T204 has a high level.

The terminal T202 of the power source circuit 201 and the terminal T23 of the switch monitoring semiconductor IC 101 are connected. The terminal T203 of the power source circuit 201, the terminal T34 of the switch monitoring semiconductor IC 101, and a terminal T301 of the microcomputer 301 are also connected. The output voltage Vo is used as the input/output source voltage VDDI in the switch monitoring semiconductor IC 101 and is used as a microcomputer source voltage MVDD in the microcomputer 301. The terminal T204 of the power source circuit 201 and the terminal T28 of the switch monitoring semiconductor IC 101 are also connected.

When a low level gate signal is output to the open drain output part 5A, if it is determined that the state of the mechanical switch M3 has been changed according to a detection result of the main voltage system detection part D3, the logic control part 4 switches the gate signal output to the open drain output part 5A from a low level to a high level and switches the wake-up bar signal WAKEB from a high level to a low level. Then, when a disable signal (high level wake-up bar signal WAKEB) is output to the terminal T204 of the power source circuit 201 from the terminal T28 of the switch monitoring semiconductor IC 101, if the state of the mechanical switch M3 is changed, the signal output from the terminal T28 of the switch monitoring semiconductor IC 101 to the terminal T204 of the power source circuit 201 is switched from the disable signal (high level wake-up bar signal WAKEB) to an enable signal (low level wake-up bar signal WAKEB). Further, if the low level gate signal is output to the open drain output part 5A, even when the state of mechanical switch M3 externally connected to the main voltage system switch input terminals T18 to T22 is changed, the logic control part 4 may perform the same controlling as described above.

When a high level gate signal is output to the open drain output part 5A, if a mode conversion command (command instructing conversion of a mode of the power source circuit 201) is received from the microcomputer 301, the logic control part 4 switches the gate signal output to the open drain output part 5A from a high level to a low level and switches the wake-up bar signal WAKEB from a low level to a high level.

When it is determined that the state of the mechanical switches M1 to M3 has been changed according to detection results from the sub-voltage system detection parts D1 and D2 and the main voltage system detection part D3, the logic control part 4 switches a gate signal output to the open drain output part 5B from a low level to a high level and switches an interrupt signal INTB from a high level to a low level.

In addition, when it is determined that the state of mechanical switches M1 to M3 externally connected to the sub-voltage system switch input terminals T2 to T8 and T10 to T16 and the main voltage system switch input terminals T18 to T22 has been changed, the logic control part 4 may perform the same control logic as described above.

Further, for example, even when a communication error in SPI communication is detected, the logic control part 4 switches the gate signal output to the open drain output part 5B from a low level to a high level and switches the interrupt signal INTB from a high level to a low level.

When it is detected that the interrupt signal INTB has been switched from a high level to a low level, the microcomputer 301 switches the chip select bar input signal CSB from a high level to a low level. At a timing at which the chip select bar input signal CSB is switched from a high level to a low level, the logic control part 4 adds a determination result regarding the mechanical switch state to the serial data output signal SO and transmits the serial data output signal SO to the microcomputer 301. Thereafter, when the chip select bar input signal CSB is switched from a low level to a high level, the logic control part 4 switches the gate signal output to the open drain output part 5B from a high level to a low level and switches the interrupt signal INTB from a low level to a high level. Through such processing, the serial data output signal SO is transmitted from the switch monitoring semiconductor IC 101 to the microcomputer 301 each time an interrupt factor occurs.

<Details of Invalidity Determination Flag>

The invalidity determination flag mentioned above will be described in detail. When the sub-voltage Vs is not within the predetermined voltage, the sub-voltage system detection parts D1 and D2 cannot allow a current to flow by the current source or draw a current. Therefore, when the sub-voltage Vs is not within the predetermined range, the detection results of the sub-voltage system detection parts D1 and D2 are indefinite.

Thus, when the sub-voltage Vs is not within the predetermined range, it is necessary to invalidate a determination result of the logic control part 4 regarding the state of the mechanical switches connected to the sub voltage-system switch input terminals T1 to T16. The invalidity determination flag mentioned above is used to notify the microcomputer 301 as to whether the determination result of the logic control part 4 regarding the state of the mechanical switches connected to the sub-voltage system switch input terminals T1 to T16 is valid or invalid.

Through external notification of the invalidity determination flag, when the sub-voltage Vs is not within the predetermined range, the switch monitoring semiconductor IC 101 selects only the mechanical switch connected to the main voltage system switch input terminals T17 to T22 as a monitoring target switch, and when the sub-voltage Vs is within the predetermined range, the switch monitoring semiconductor IC 101 selects the mechanical switches connected to the main voltage system switch input terminals T1 to T16 and the mechanical switch connected to the main voltage system switch input terminals T17 to T22 as monitoring target switches. That is to say, the switch monitoring semiconductor IC 101 may select only switches from which an accurate monitoring result can be obtained according to a state of the sub-voltage Vs, as monitoring target switches.

The switch monitoring semiconductor IC 101 has a continuous monitoring mode and an intermittent monitoring mode. The logic control part 4 executes one of the continuous monitoring mode and the intermittent monitoring mode according to a setting written in the register.

Figure 5:
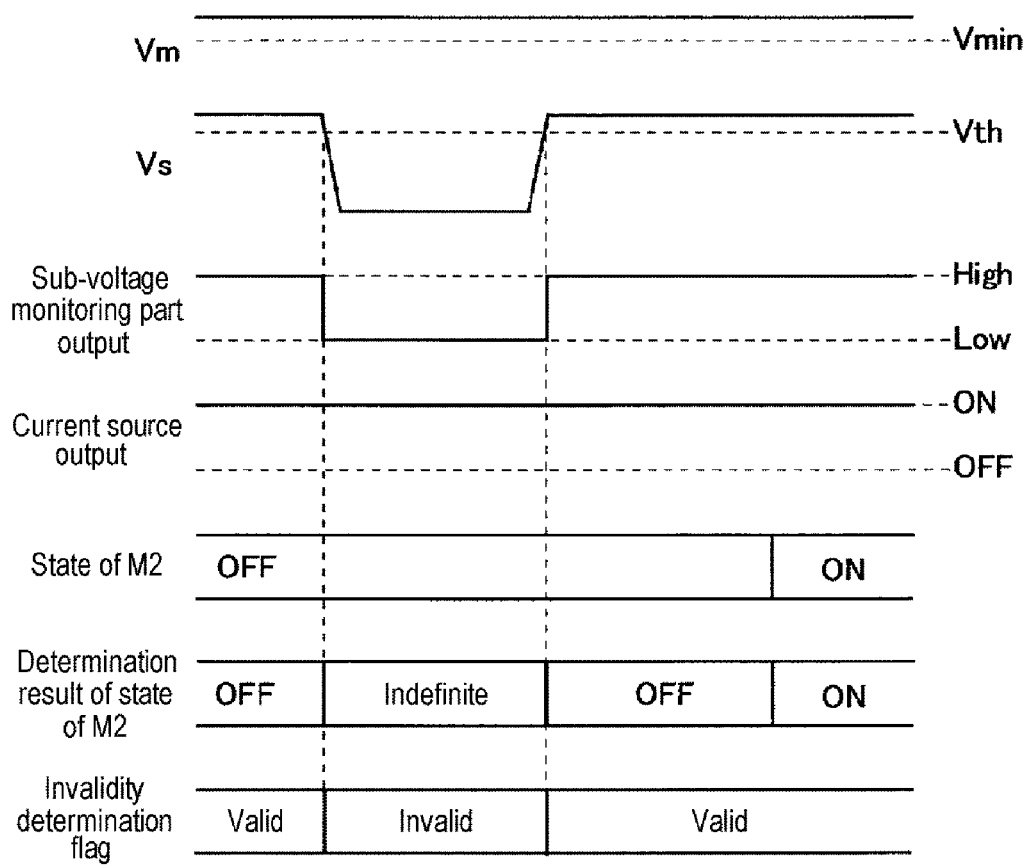
FIG. 5 is a timing chart illustrating a continuous monitoring operation of a switch monitoring semiconductor integrated circuit (IC) in the first configuration example.

FIG. 5 is a timing chart illustrating a continuous monitoring operation of the switch monitoring semiconductor IC 101. In the continuous monitoring operation, the logic control part 4 controls one of the switches SW1 and SW2 to be in a continuous ON state, and controls the switches SW3 and SW4 to be in a continuous ON state. An output of one of the current sources IS1 and IS2 of the sub-voltage system detection part D1 becomes continuously ON, an output of the current source IS3 of the sub-voltage system detection part D2 becomes continuously ON, and an output of the current source IS4 of the main voltage system detection part D3 becomes continuously ON.

Here, a case where the state of the mechanical switch M2 is changed as illustrated in FIG. 5 will be described. The main voltage Vm is always equal to or higher than a minimum value Vmin at which the power source part 2 can normally generate the reference voltage VREF. The logic control part 4 determines a state of the mechanical switch at each rising edge of the clock signal CK. However, during a period in which the sub-voltage Vs is lower than the threshold Vth and the output signal of the sub-voltage monitoring part 1 has a low level, the detection results of the sub-voltage system detection parts D1 and D2 are indefinite. Accordingly, as illustrated in FIG. 5, during the period in which the output signal of the sub-voltage monitoring part 1 has a low level, the determination result of the state of the mechanical switch M2 by the logic control part 4 is also indefinite. Here, during the period in which the output signal of the sub-voltage monitoring part 1 has a low level, the invalidity determination flag is set to an invalid flag (a flag indicating that the determination result of the logic control part 4 regarding a state of the mechanical switches connected to the sub-voltage system switch input terminals T1 to T16 is invalid).

Figure 6:
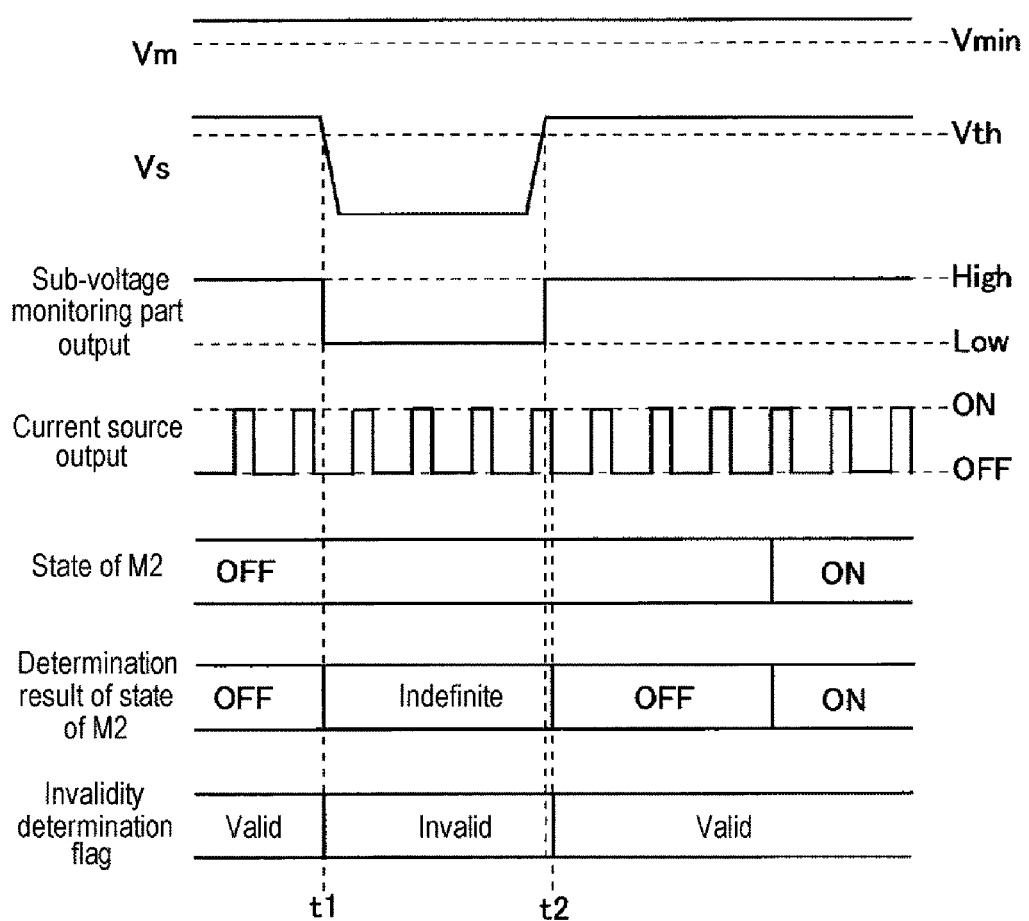
FIG. 6 is a timing chart illustrating an intermittent monitoring operation of a switch monitoring semiconductor IC in the first configuration example.

FIG. 6 is a timing chart illustrating an intermittent monitoring operation of the switch monitoring semiconductor IC 101. In the intermittent monitoring operation, the logic control part 4 controls one of the switches SW1 and SW2 to be in an intermittent ON state, and controls the switches SW3 and SW4 to be in an intermittent ON state. An output of one of the current sources IS1 and IS2 of the sub-voltage system detection part D1 becomes intermittently ON, an output of the current source IS3 of the sub-voltage system detection part D2 becomes intermittently ON, and an output of the current source IS4 of the main voltage system detection part D3 becomes intermittently ON.

Here, a case where the state of the mechanical switch M2 is changed as illustrated in FIG. 5 will be described. The main voltage Vm is always equal to or higher than a minimum value Vmin at which the power source part 2 can normally generate the reference voltage VREF. The logic control part 4 determines a state of the mechanical switch immediately before the current source output is switched from ON to OFF. However, during a period in which the sub-voltage Vs is lower than the threshold Vth and the output signal of the sub-voltage monitoring part 1 has a low level, the detection results of the sub-voltage system detection parts D1 and D2 are indefinite. Accordingly, as illustrated in FIG. 6, during a period having a timing t1 as a start point and a timing t2 as an end point, the determination result of the state of the mechanical switch M2 by the logic control part 4 is also indefinite. The timing t1 is a point at which a period in which the output signal of the sub-voltage monitoring part 1 has a low level starts, and the timing t2 is a point at which the current source output is first switched from ON to OFF after the period in which the output signal of the sub-voltage monitoring part 1 has a low level ends. Here, during the period having the timing t1 as the start point and the timing t2 as the end point, the invalidity determination flag is set to an invalid flag (a flag indicating that the determination result of the logic control part 4 regarding the state of the mechanical switches connected to the sub-voltage system switch input terminals T1 to T16 is invalid).

Alternatively, in order to simplify the control logic in the logic control part 4 for intermittent monitoring operations, like the continuous monitoring operation, a period during which the invalidity determination flag is set to an invalid flag (a flag indicating that the determination result of the logic control part 4 regarding a state of mechanical switches connected to the sub-voltage system switch input terminals T1 to T16 is invalid) may be a period during which the output signal of the sub-voltage monitoring part 1 has a low level. In this case, since the switch monitoring semiconductor IC 101 and the microcomputer 301 operate asynchronously, the microcomputer 301 cannot recognize the timing t2 at which the current source output is first switched from ON to OFF after the end of the period during which the output signal of the sub-voltage monitoring part 1 has a low level. In this case, however, the microcomputer 301 may store a setting regarding a period of the current source output, and further invalidate a determination result of the logic control part 4 until one period of the current source output has elapsed after the invalidity determination flag is switched from the invalid flag to a valid flag. With this configuration, although a time lag of a maximum of one period of the current source output occurs, it is possible to prevent the microcomputer 301 from erroneously determining a state of the mechanical switches.

In the aforementioned example, the logic control part 4 determines a state of the mechanical switches immediately before the current source output is switched from ON to OFF, but the determination timing is not limited thereto. For example, the logic control part 4 may determine a state of the mechanical switches immediately after the current source output is switched from OFF to ON or may determine a state of the mechanical switches midway through every period during which the current source output is ON. In addition, the timing t2 may be changed according to a change in determination timing.

Second Configuration Example

Figure 7:
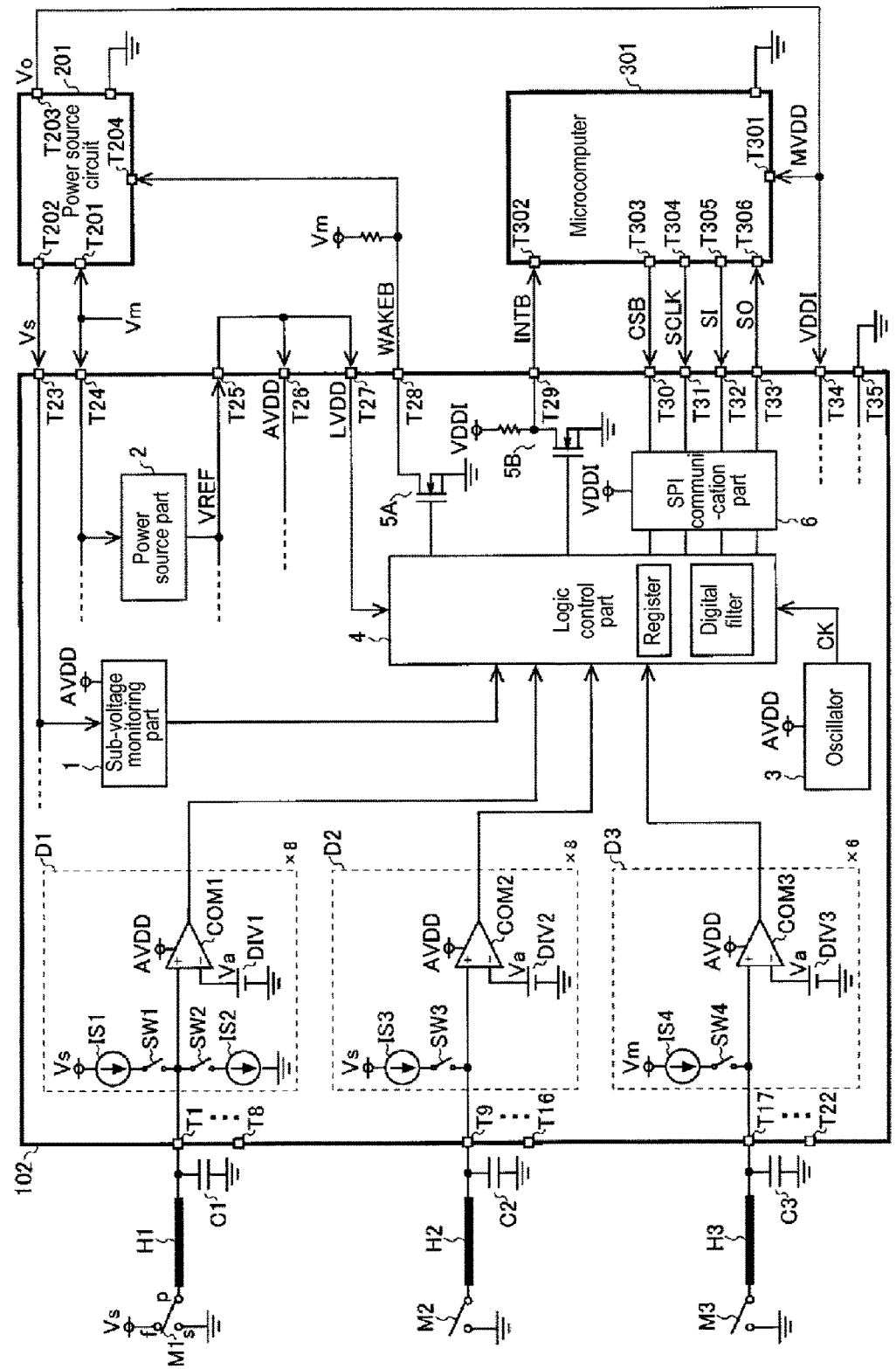
FIG. 7 is a diagram illustrating a second configuration example of an electronic control unit.

FIG. 7 is a diagram illustrating a second configuration example of an electronic control unit. The electronic control unit of FIG. 7 has a switch monitoring semiconductor IC 102, a power source circuit 201, and a microcomputer 301. In FIG. 7, the same parts as those of FIG. 1 will be denoted by the same reference numerals, and a detailed description thereof will be omitted.

The switch monitoring semiconductor IC 102 is different from the switch monitoring semiconductor IC 101 in that the logic control part 4 has a digital filter, and is the same as the switch monitoring semiconductor IC 101 in other parts.

The logic control part 4 samples the detection results of the sub-voltage system detection parts D1 and D2 and the detection result of the main voltage system detection part D3 at a predetermined sampling period using a digital filtering function, and if the same detection result continues for a predetermined number of times after the detection result is changed, it is determined that the state of the corresponding mechanical switch has been changed. Further, in the intermittent monitoring mode, the determination result is reflected when the clock signal CK first rises after it is determined that the state of the mechanical switch has been changed. It is desirable that the predetermined sampling period be changed according to a setting written in the register. It is also desirable that the predetermined number of times be changeable according to the setting written in the register. For example, an arbitrary number of times may be selected from among one to six times. When the predetermined number of times is set to one time, the switch monitoring semiconductor IC 102 substantially performs the same processing as the switch monitoring semiconductor IC 101.

The switch monitoring semiconductor IC 102 has a continuous monitoring mode and an intermittent monitoring mode. The logic control part 4 executes one of the continuous monitoring mode and the intermittent monitoring mode according to the setting written in the register.

FIGS. 8A and 8B are timing charts illustrating a continuous monitoring operation of the switch monitoring semiconductor IC 102. In the continuous monitoring operation, the logic control part 4 controls one of the switches SW1 and SW2 to be in a continuous ON state, and controls the switches SW3 and SW4 to be in a continuous ON state. An output of one of the current sources IS1 and IS2 of the sub-voltage system detection part D1 becomes continuously ON, an output of the current source IS3 of the sub-voltage system detection part D2 becomes continuously ON, and an output of the current source IS4 of the main voltage system detection part D3 becomes continuously ON.

Here, a case where the state of the mechanical switch M2 is changed as illustrated in FIGS. 8A and 8B will be described. In FIGS. 8A and 8B, a case where the predetermined number of times of the digital filter is set to three times is illustrated. The main voltage Vm is always equal to or higher than a minimum value Vmin at which the power source part 2 can normally generate the reference voltage VREF. The logic control part 4 determines a state of the mechanical switch at each rising edge of the clock signal CK. However, during a period in which the sub-voltage Vs is lower than the threshold Vth and the output signal of the sub-voltage monitoring part 1 has a low level, detection results of the sub-voltage system detection parts D1 and D2 are indefinite. Accordingly, as illustrated in FIGS. 8A and 8B, during the period in which the output signal of the sub-voltage monitoring part 1 has a low level, a determination result of a state of the mechanical switch M2 by the logic control part 4 is also indefinite. Further, due to the digital filtering function, even after the lapse of the period during which the output signal of the sub-voltage monitoring part 1 has a low level, the indefinite state continues until the result of sampling the state of the mechanical switch M2 is the same three consecutive times.

For example, in FIG. 8A, since it is determined that the state of the mechanical switch M2 is OFF for three consecutive times after the lapse of the period during which the output signal of the sub-voltage monitoring part 1 has a low level, the duration of the indefinite state becomes short. On the other hand, in FIG. 8B, it is determined that the state of the mechanical switch M2 is ON in the second determination time after the lapse of the period during which the output signal of the sub-voltage monitoring part 1 has a low level, and thereafter, it is determined that the state of the mechanical switch M2 is OFF for three consecutive times. Thus, the duration of the indefinite state becomes longer than that of FIG. 8A. Since the extent to which the duration of the indefinite state extends depends on the influence of noise, the microcomputer 301 cannot recognize the extent to which the duration of the indefinite state extends. Therefore, when the logic control part 4 has the digital filter as in the present configuration example, it is necessary for the switch monitoring semiconductor IC 102 to inform the microcomputer 301 of the end time of the duration of the indefinite state.

Therefore, as illustrated in FIGS. 8A and 8B, the switch monitoring semiconductor IC 102 is configured such that the invalidity determination flag is set to an invalid flag (a flag indicating that the determination result of the logic control part 4 regarding the state of the mechanical switch connected to the sub-voltage system switch input terminals T1 to T16 is invalid) until the determination result of the state of the mechanical switch (in FIGS. 8A and 8B, the mechanical switch M2 is illustrated as an example) connected to the sub-voltage system switch input terminals T1 to T16 is indefinite even after the lapse of the period during which the output signal of the sub-voltage monitoring part 1 has a low level.

Figure 9B:
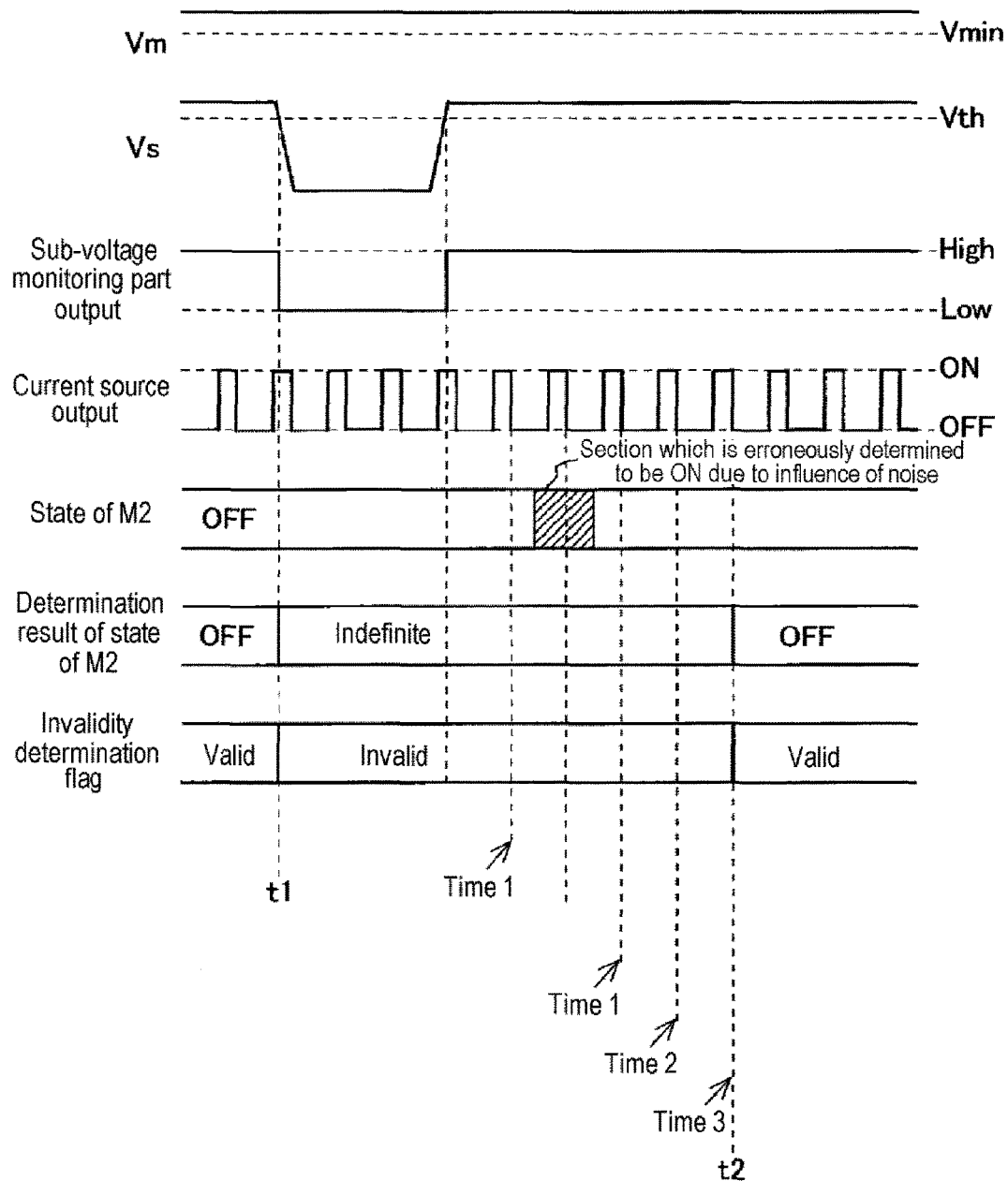
FIG. 9B is a timing chart illustrating an intermittent monitoring operation of a switch monitoring semiconductor IC in the second configuration example.

FIGS. 9A and 9B are timing charts illustrating an intermittent monitoring operation of the switch monitoring semiconductor IC 102. In the intermittent monitoring operation, the logic control part 4 controls one of the switches SW1 and SW2 to be in an intermittently ON state, and controls the switches SW3 and SW4 to be in an intermittently ON state. An output of one of the current sources IS1 and IS2 of the sub-voltage system detection part D1 becomes intermittently ON, an output of the current source IS3 of the sub-voltage system detection part D2 becomes intermittently ON, and an output of the current source IS4 of the main voltage system detection part D3 becomes intermittently ON.

Here, a case where the state of the mechanical switch M2 is changed as illustrated in FIGS. 9A and 9B will be described. In FIGS. 9A and 9B, a case where the predetermined number of times of the digital filter is set to three times is illustrated. The main voltage Vm is always equal to or higher than a minimum value Vmin at which the power source part 2 can normally generate the reference voltage VREF. The logic control part 4 determines a state of a mechanical switch immediately before the current source output is switched from ON to OFF. However, during a period in which the sub-voltage Vs is lower than the threshold Vth and an output signal of the sub-voltage monitoring part 1 has a low level, detection results of the sub-voltage system detection parts D1 and D2 are indefinite. Accordingly, as illustrated in FIGS. 9A and 9B, during the period in which the output signal of the sub-voltage monitoring part 1 has a low level, a determination result of a state of the mechanical switch M2 by the logic control part 4 is also indefinite. Further, due to the digital filtering function, even after the lapse of the period during which the output signal of the sub-voltage monitoring part 1 has a low level, the indefinite state continues until the result of sampling the state of the mechanical switch M2 becomes the same three consecutive times.

For example, in FIG. 9A, since it is determined that the state of the mechanical switch M2 is OFF for three consecutive times after the period during which the output signal of the sub-voltage monitoring part 1 has a low level, the duration of the indefinite state becomes short. On the other hand, in FIG. 9B, it is determined that the state of the mechanical switch M2 is ON in the second determination time after the period during which the output signal of the sub-voltage monitoring part 1 has a low level, and thereafter, it is determined the state of the mechanical switch M2 is OFF for three consecutive times. Thus, the duration of the indefinite state becomes longer than that of FIG. 9A. Since the extent to which the duration of the indefinite state extends depends on the influence of noise, the microcomputer 301 cannot recognize the extent to which the duration of the indefinite state extends. Therefore, when the logic control part 4 has the digital filter as in the present configuration example, it is necessary for the switch monitoring semiconductor IC 102 to inform the microcomputer 301 when the duration of the indefinite state has ended.

Therefore, as illustrated in FIGS. 9A and 9B, the switch monitoring semiconductor IC 102 is configured such that the invalidity determination flag is set to an invalid flag (a flag indicating that the determination result of the logic control part 4 regarding the state of the mechanical switch connected to the sub-voltage system switch input terminals T1 to T16) is invalid until the determination state of the mechanical switch (in FIGS. 9A and 9B, the mechanical switch M2 is illustrated as an example) connected to the sub-voltage system switch input terminals T1 to T16 becomes indefinite even after the lapse of the period during which the output signal of the sub-voltage monitoring part 1 has a low level.

Further, in the aforementioned example, the logic control part 4 determines the state of the mechanical switch immediately before the current source output is switched from ON to OFF, but the determination timing is not limited thereto. For example, the state of the mechanical switch may be determined immediately after the current source output is switched from OFF to ON. Moreover, for example, the state of the mechanical switch may be determined midway through every period during which the current source output is ON. In addition, as the determination timing is changed, the timing t2 which is the end point of the period during which the invalidity determination flag is set to an invalid flag (a flag indicating that the determination result of the logic control part 4 regarding the state of the mechanical switch connected to the sub-voltage system switch input terminals T1 to T16 is invalid) may be changed.

(Applications)

Figure 10:
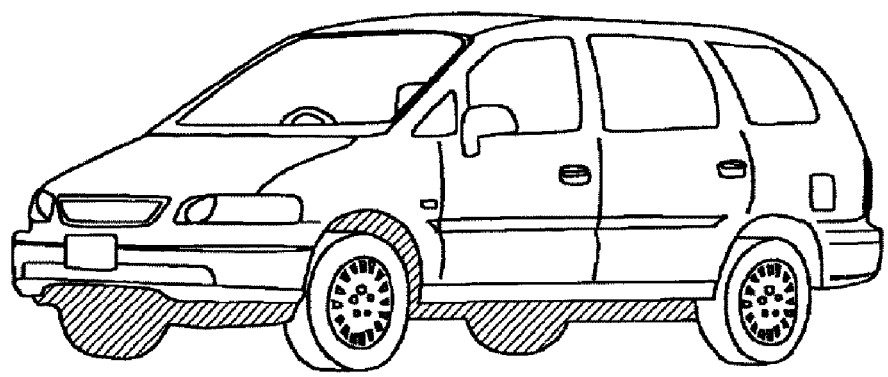
FIG. 10 is an external view of a vehicle equipped with an electronic control unit.

The electronic control unit may be mounted on, for example, a vehicle X10 shown in FIG. 10. In this case, as mechanical switches connected to the main voltage system switch input terminals T17 to T22, for example, a door opening/closing switch, a door locking switch, and the like may be considered. Further, as mechanical switches connected to the sub-voltage system switch input terminals T1 to T16, for example, a power window switch, a door mirror switch, a cam signal switch, an air flow switch, a throttle opening/closing switch, and the like may be considered. In the case where the electronic control unit is mounted on the vehicle X10 illustrated in FIG. 10, the main voltage Vm may be an output voltage of the battery mounted on the vehicle X10.

In addition to the vehicle, it may be considered that the electronic control unit is applied to, for example, an industrial machine field or the like.

<Notes>

Various technical features disclosed herein may be differently modified, as well as the aforementioned embodiments, without departing from the gist of the technical creation of the present disclosure. For example, in the aforementioned embodiments, SPI communication is used for communication between the switch monitoring semiconductor IC and the microcomputer, but other serial communication (for example, I2C communication or the like) may be used, and communications other than serial communication may be used. Further, unlike the aforementioned embodiments, a dedicated terminal for transmitting the invalidity determination flag may be installed in the switch monitoring semiconductor IC and a dedicated terminal for receiving the invalidity determination flag may be installed in the microcomputer. That is to say, the aforementioned embodiments are merely illustrative in all aspects and should not be understood as limiting, and the technical scope of the present disclosure is not the description of the aforementioned embodiments but presented by the accompanying claims. Thus, it is to be understood that it includes all modifications that fall within the meaning and scope of the accompanying claims and their equivalents.

According to the present disclosure in some embodiments, it is possible to appropriately select a monitoring target switch according to a state of a sub-voltage supplied from an outside source. Further, since the electronic control unit and the vehicle disclosed herein include the switch monitoring semiconductor IC, it is possible to appropriately select a monitoring target switch according to states of a main voltage and a sub-voltage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor integrated circuit (IC) for monitoring a switch, comprising:
   a first detection part configured to detect a state of a first switch when a main voltage supplied from outside is equal to or higher than a first predetermined value;
   a second detection part configured to detect a state of a second switch when the main voltage is equal to or higher than the first predetermined value and a sub-voltage supplied from outside is equal to or higher than a second predetermined value;
   a sub-voltage monitoring part configured to monitor whether the sub-voltage is within a predetermined range, where a minimum value of the predetermined range is greater than or equal to the second predetermined value;
   a switch monitoring part configured to monitor a change in a state of the first switch according to a detection result of the first detection part and to monitor a change in a state of the second switch according to a detection result of the second detection part;
   a setting part configured to determine an invalid period, during which a monitoring result of the switch monitoring part regarding the change in the state of the second switch is invalidated, according to a monitoring result of the sub-voltage monitoring part; and
   a transmission part configured to transmit a monitoring result of the switch monitoring part and information on the invalid period determined by the setting part outside of the semiconductor IC.

2. The circuit of claim 1, wherein the switch monitoring part is configured to sample the detection result of the second detection part at a predetermined sampling period, and determine that the state of the second switch has been changed when the same detection result continues a predetermined number of times after the detection result of the second detection part is changed, and
   wherein the setting part is configured to set an end time of the invalid period based on a timing when the switch monitoring part determines that the state of the second switch has been changed after the sub-voltage has been changed from outside of the predetermined range into the predetermined range.

3. The circuit of claim 1, further comprising a power source part configured to convert the main voltage into a source voltage and output the source voltage,
   wherein the source voltage is supplied to each of the first detection part, the second detection part, the sub-voltage monitoring part, the switch monitoring part, and the setting part.

4. The circuit of claim 1, wherein, when the first switch has been changed from a first state to a second state, the transmission part transmits the monitoring result, which indicates the change of the first switch from the first state to the second state, outside of the semiconductor IC.

5. The circuit of claim 1, wherein the transmission part transmits the monitoring result of the switch monitoring part and the information on the invalid period determined by the setting part outside of the semiconductor IC through serial communication.

6. The circuit of claim 5, wherein the serial communication is serial peripheral interface (SPI) communication.

7. An electronic control unit, comprising:

the switch monitoring semiconductor IC of claim 1;

a microcomputer configured to receive the monitoring result of the switch monitoring part and the information on the invalid period determined by the setting part from the switch monitoring semiconductor IC; and a power source circuit configured to convert the main voltage into the sub-voltage and supply the sub-voltage to the switch monitoring semiconductor IC.

8. An electronic control unit, comprising:

the switch monitoring semiconductor IC of claim 4;

a microcomputer configured to receive the monitoring result of the switch monitoring part and the information on the invalid period determined by the setting part from the switch monitoring semiconductor IC; and a power source circuit configured to convert the main voltage into the sub-voltage and supply the sub-voltage to the switch monitoring semiconductor IC, wherein the transmission part transmits the monitoring result, which indicates the change of the first switch from the first state to the second state, to the power source circuit, when the first switch has been changed from the first state to the second state, and the power source circuit starts an operation of converting the main voltage into the sub-voltage when receiving a signal indicating that the first switch has been changed from the first state to the second state.

9. The control unit of claim 8, wherein the microcomputer starts up after the power source circuit starts the operation of converting the main voltage into the sub-voltage, and at least a portion of the transmission part starts to be driven by a power source voltage for the transmission part.

10. A vehicle, comprising:

a first switch;

a second switch; and the electronic control unit of claim 7.

* * * * *